United States Patent
Yokosuka et al.

(10) Patent No.: US 10,446,359 B2
(45) Date of Patent: Oct. 15, 2019

(54) CHARGED PARTICLE BEAM DEVICE

(71) Applicant: Hitachi High-Technologies Corporation, Minato-ku, Tokyo (JP)

(72) Inventors: Toshiyuki Yokosuka, Tokyo (JP); Hideyuki Kazumi, Tokyo (JP); Yuzuru Mizuhara, Tokyo (JP); Hajime Kawano, Tokyo (JP)

(73) Assignee: Hitachi High-Technologies Corporation, Tokyo (JP)

( * ) Notice: Subject to any disclaimer, the term of this patent is extended or adjusted under 35 U.S.C. 154(b) by 0 days.

(21) Appl. No.: 15/545,550

(22) PCT Filed: Jan. 28, 2015

(86) PCT No.: PCT/JP2015/052250
§ 371 (c)(1),
(2) Date: Jul. 21, 2017

(87) PCT Pub. No.: WO2016/121009
PCT Pub. Date: Aug. 4, 2016

(65) Prior Publication Data
US 2018/0012725 A1  Jan. 11, 2018

(51) Int. Cl.
*H01J 37/05* (2006.01)
*H01J 37/28* (2006.01)
(Continued)

(52) U.S. Cl.
CPC .......... *H01J 37/05* (2013.01); *H01J 37/265* (2013.01); *H01J 37/28* (2013.01); *H01J 37/292* (2013.01);
(Continued)

(58) Field of Classification Search
CPC .. H01J 37/00; H01J 37/02; H01J 37/05; H01J 37/07; H01J 37/22; H01J 37/222;
(Continued)

(56) References Cited

U.S. PATENT DOCUMENTS 6,232,787 B1 * 5/2001 Lo .................. H01J 37/268
250/311
6,700,122 B2   3/2004 Matsui et al.
(Continued)

FOREIGN PATENT DOCUMENTS

JP      2007-256125 A    10/2007
JP         4147233 B2     9/2008
(Continued)

OTHER PUBLICATIONS

International Search Report (PCT/ISA/210) issued in PCT Application No. PCT/JP2015/052250 dated Mar. 3, 2015 with English translation (four pages).

(Continued)

*Primary Examiner* — Jason L McCormack
(74) *Attorney, Agent, or Firm* — Crowell & Moring LLP

(57) ABSTRACT

Provided is a charged particle beam device that enables, even if a visual field includes therein a plurality of regions having different secondary electron emission conditions, the setting of appropriate energy filter conditions adapted to each of these regions. The charged particle beam device is equipped with a detector for detecting charged particles obtained on the basis of scanning, over a sample, a charged particle beam emitted from a charged particle source, and an energy filter for filtering by energy the charged particles emitted from the sample. Index values are determined for the plurality of regions contained within the scanning region of the charged particle beam, and, for each of a plurality of energy filter conditions, differences are calculated between the plurality of index values and the reference index values that have been set for each of the plurality of regions.

9 Claims, 7 Drawing Sheets

(51) Int. Cl.
*H01J 37/26* (2006.01)
*H01J 37/29* (2006.01)

(52) U.S. Cl.
CPC .................. *H01J 2237/2487* (2013.01); *H01J 2237/24592* (2013.01); *H01J 2237/2814* (2013.01); *H01J 2237/2817* (2013.01)

(58) Field of Classification Search
CPC ........ H01J 37/228; H01J 37/24; H01J 37/241; H01J 37/244; H01J 37/26; H01J 37/261; H01J 37/304
USPC ...................... 250/306, 307, 311, 396 R, 397
See application file for complete search history.

(56) References Cited

U.S. PATENT DOCUMENTS

| | | | |
|---|---|---|---|
| 8,890,068 B2 | 11/2014 | Kasai et al. | |
| 2004/0211899 A1 | 10/2004 | Ezumi et al. | |
| 2007/0222464 A1* | 9/2007 | Honda | G01R 31/307 324/754.22 |
| 2009/0309022 A1* | 12/2009 | Gunji | G01N 23/2251 250/307 |
| 2013/0248705 A1* | 9/2013 | Hayashi | H01J 37/02 250/307 |
| 2014/0001360 A1* | 1/2014 | Kasai | H01J 37/244 250/307 |
| 2014/0124666 A1 | 5/2014 | Sasaki et al. | |
| 2015/0228063 A1* | 8/2015 | Minakawa | H01J 37/244 382/151 |

FOREIGN PATENT DOCUMENTS

| | | | |
|---|---|---|---|
| JP | 2013-92530 A | 5/2013 | |
| JP | 2014-81220 A | 5/2014 | |
| JP | 5584159 B2 | 9/2014 | |
| JP | 5663412 B2 | 2/2015 | |

OTHER PUBLICATIONS

Japanese-language Written Opinion (PCT/ISA/237) issued in PCT Application No. PCT/JP2015/052250 dated Mar. 3, 2015 (four pages).
Korean-language Office Action issued in counterpart Korean Application No. 10-2017-7020313 dated Jul. 17, 2018 (four pages).
Korean-language Notice of Allowance issued in counterpart Korean Application No. 10-2017-7020313 dated Jan. 2, 2019 with English translation (five (5) pages).

* cited by examiner

[FIG. 1]
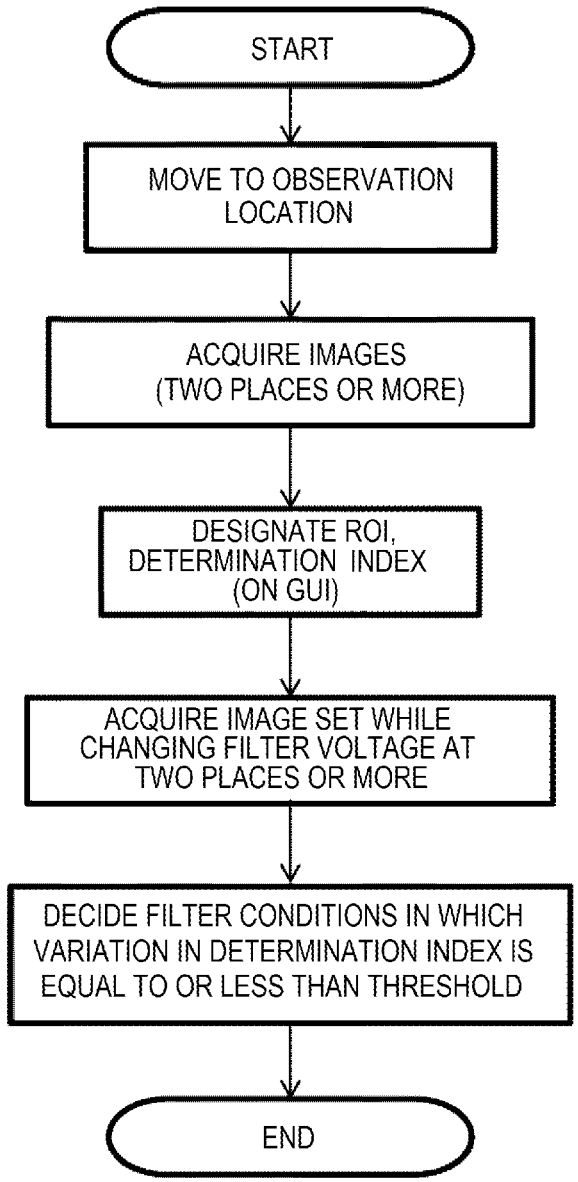

[FIG. 2]
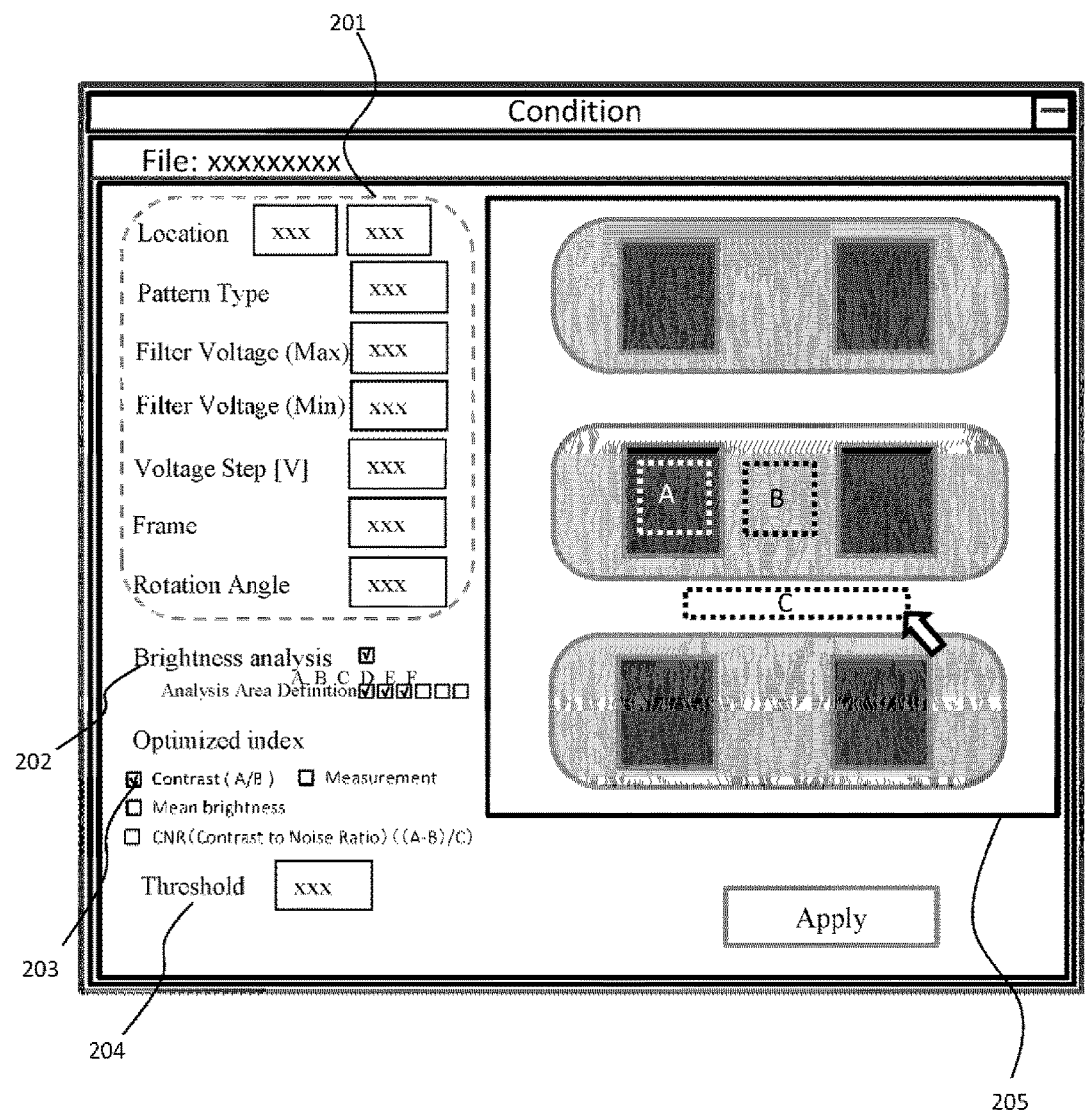

[FIG. 3]
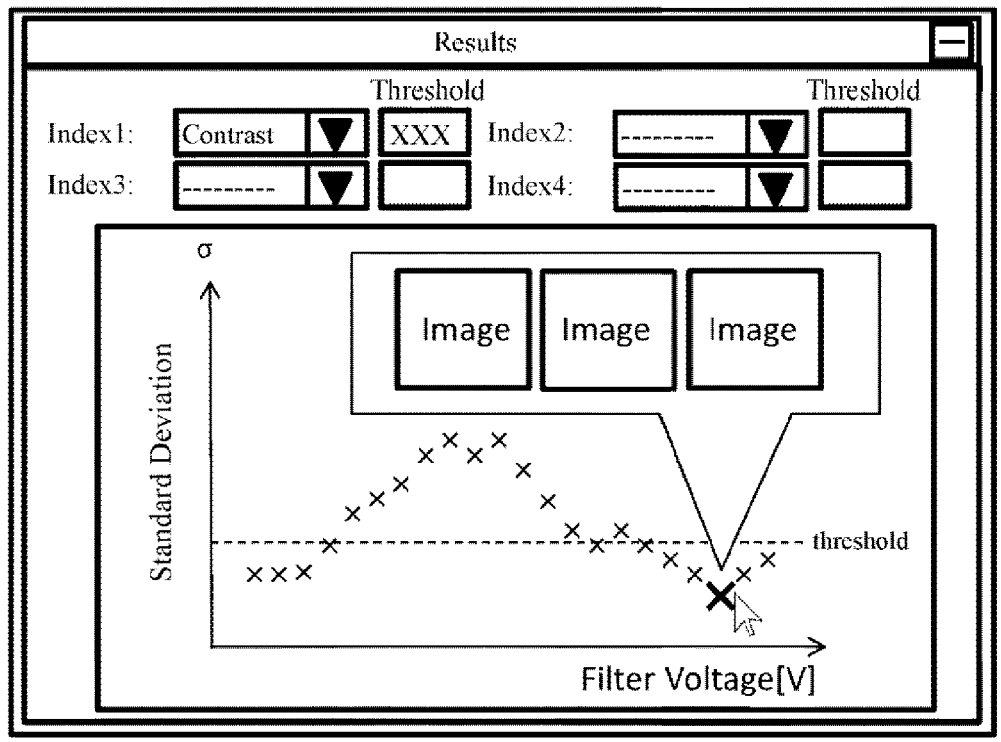
[FIG. 4]
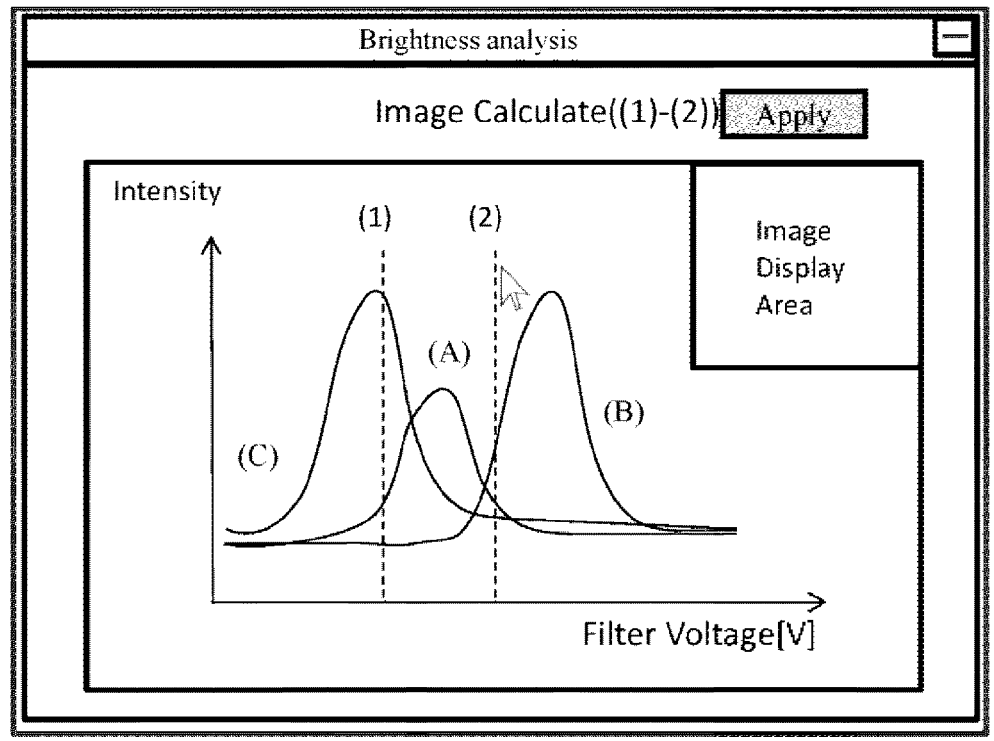

[FIG. 5]
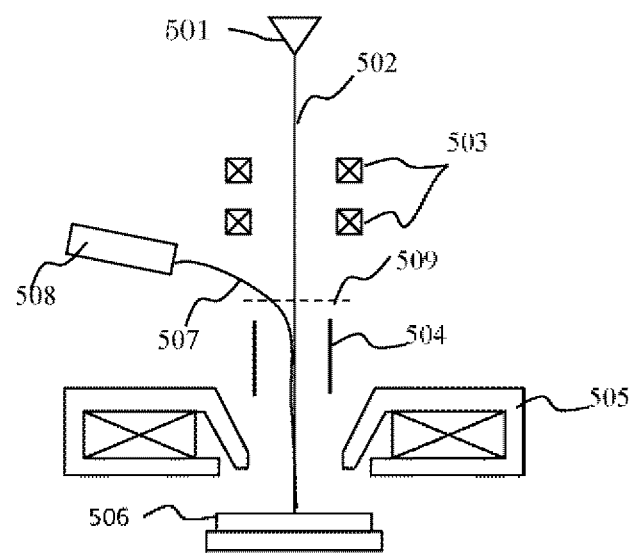

[FIG. 6]
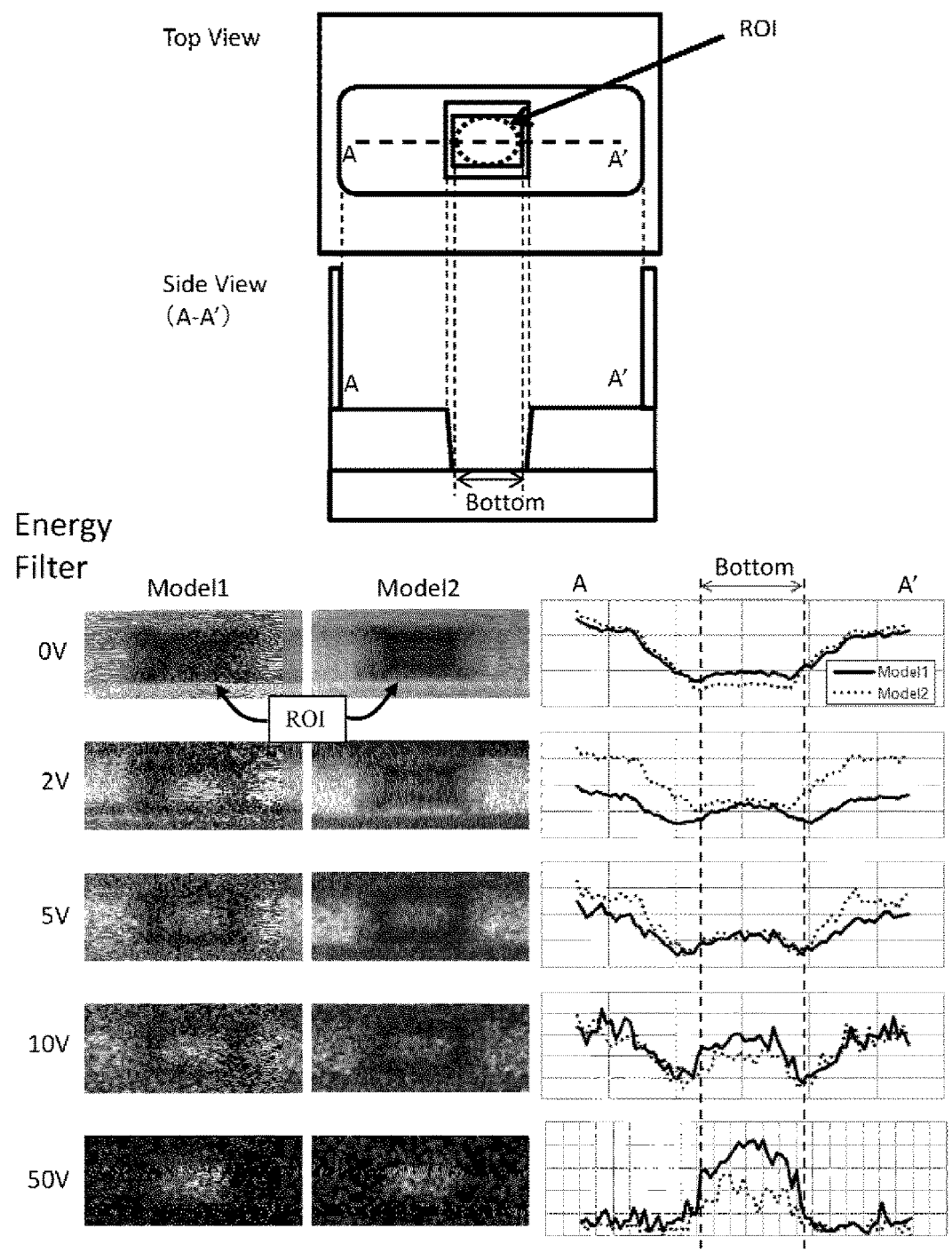

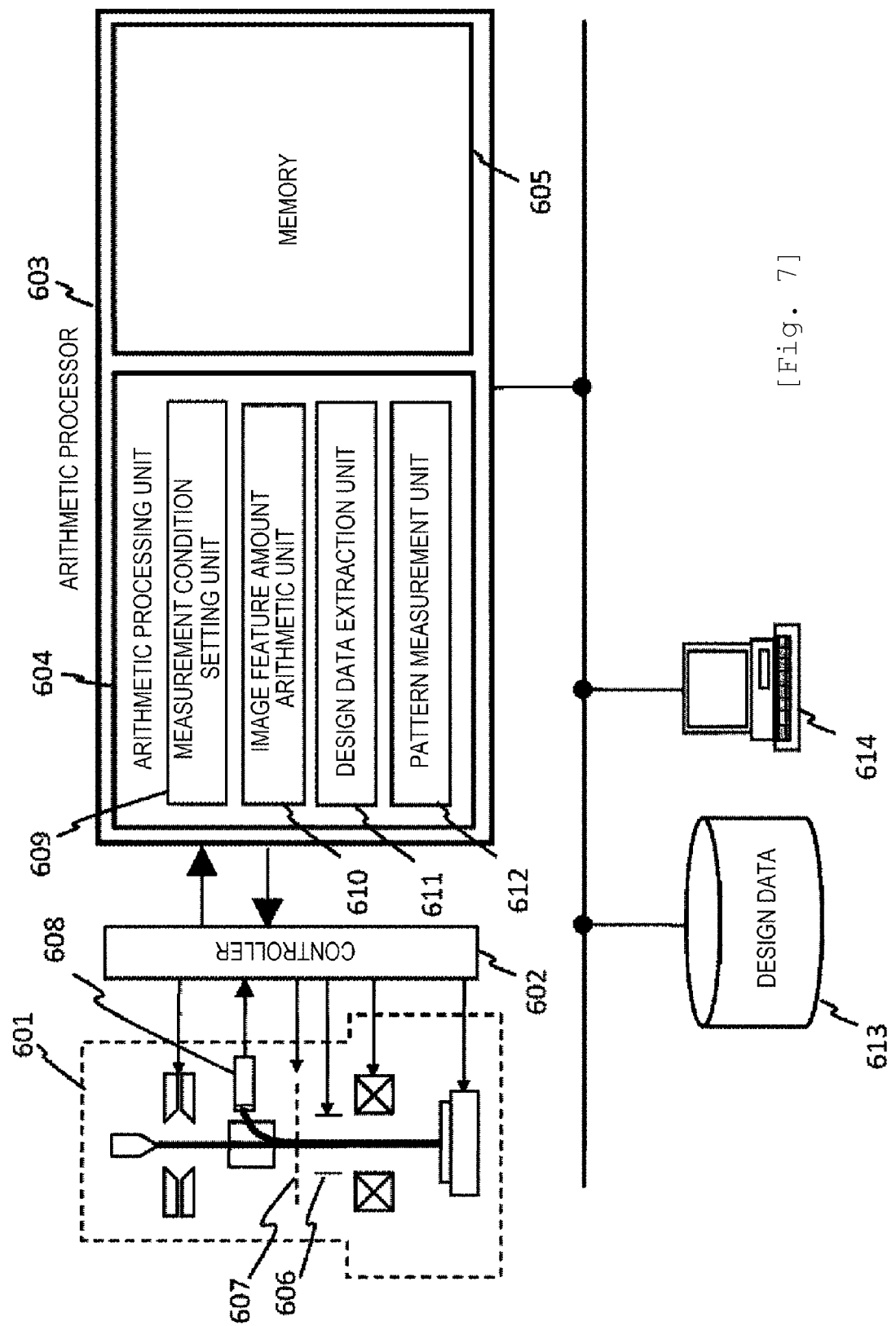
[Fig. 7]

[FIG. 8]
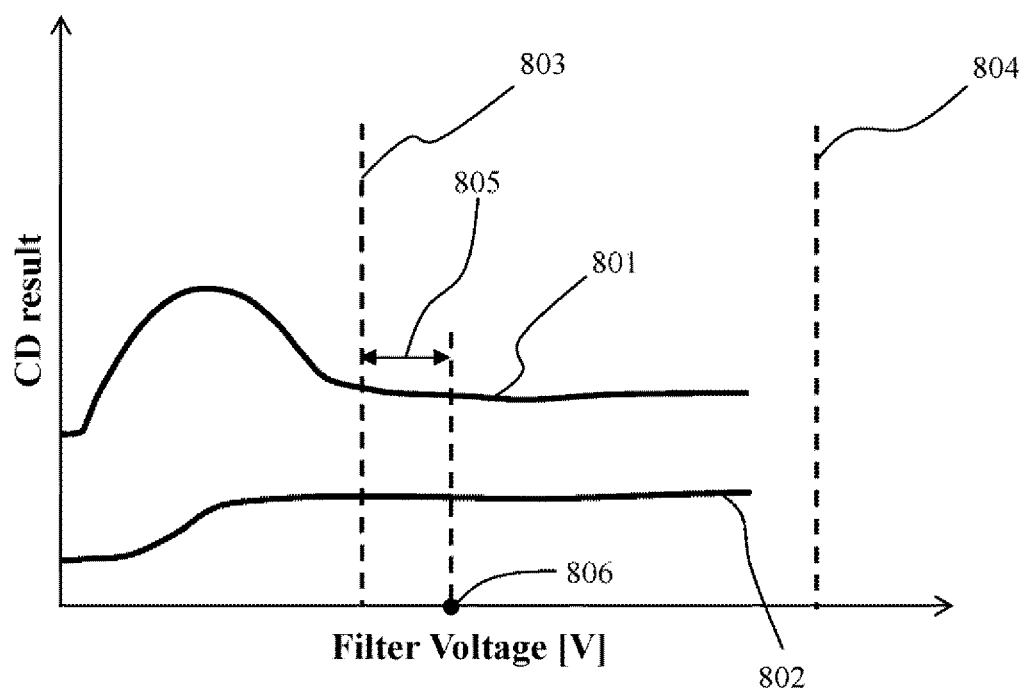

CHARGED PARTICLE BEAM DEVICE

TECHNICAL FIELD

The present invention relates to a charged particle beam device, and particularly relates to a charged particle beam device that generates image data and signal waveform data by scanning of a charged particle beam.

BACKGROUND ART

Along with miniaturization of a semiconductor pattern, a slight difference in shape affects operating characteristics of devices, and needs for management of shapes are increased. Accordingly, high sensitivity and high accuracy are required more than before in a scanning electron microscope (SEM) used for inspecting and measuring semiconductors. In the SEM, when a sample is irradiated with an electron beam, secondary electrons emitted from the sample is detected to observe a surface shape. At this time, the secondary electrons to be detected have low energy and are easily affected by charging of the sample. Effects of charging become obvious by the use of low-dielectric constant materials such as low-k, and there is a case where it is difficult to capture a signal in a region necessary to be managed (ROI: Region Of Interest). Also in normal detection of secondary electrons, there exists a case where observation itself becomes difficult due to miniaturization and high aspect ratio in holes and trenches in recent years.

In such case, to relatively emphasize information of an observation position by discriminating electrons to be detected according to energy or angles of electrons can be a solution.

In Patent Literature 1, there is disclosed, in an electron microscope including an energy filter, a method of finding an applied voltage of an energy filter in which luminance variation is increased by creating a graph indicating the applied voltage of the energy filter and the luminance in a beam irradiation unit. Also, in Patent Literature 2, there is disclosed, in a scanning electron microscope including an energy filter, a method of calculating an optimum filter voltage from a gradation ratio of images by selecting two areas and acquiring images in the areas where the filter voltage is changed. In Patent Literature 3, there is disclosed a method of determining a filter voltage in which the maximum contrast is obtained by detecting signal intensities at the time of changing an energy filter voltage and calculating a contrast from signal intensities at two points.

CITATION LIST

Patent Literature

Patent Literature 1: Japanese Patent No. 5663412 (corresponding US Patent US 2014/0124666)
Patent Literature 2: Japanese Patent No. 5584159 (corresponding U.S. Pat. No. 8,890,068)
Patent Literature 3: Japanese Patent No. 4147233 (corresponding U.S. Pat. No. 6,700,122)

SUMMARY OF INVENTION

Technical Problem

In order to acquire a potential contrast image by using the energy filter, it is necessary to previously determine a voltage to be applied to the energy filter. On the other hand, a large number of various structures formed of many kinds of materials and structures are included in one field of view (FOV) due to miniaturization and complication of patterns. This means diversification of an emission amount, emission energy and so on of secondary electrons in respective regions in a FOV. That is, appropriate energy filter conditions in respective regions in a FOV are different. A method of setting appropriate energy filter conditions under such environment is not disclosed in Patent Literatures 1 to 3.

Furthermore, it is desirable to perform measurement all at once by scanning with respect to one FOV (one image) while putting plural measurement points in one FOV for increasing the speed of measurement and inspection, however, it is difficult to realize high-speed measurement when appropriate energy filter conditions are different in respective plural measurement points. In Patent Literature 2, a technique in which two areas are set in an image and a voltage is applied to the energy filter so that a gradation ratio in the two areas is increased is explained. This method is excellent for measuring one area with high accuracy as the gradation difference between two areas is increased according to the method, however, the method is not suitable for measurement using the image including plural measurement points with different conditions in one FOV as a gradation value in the other area is reduced. Although explanation has been made also in Patent Literatures 1 and 3 concerning methods of calculating energy filter conditions, a method of calculating energy filter conditions at the time of measuring plural measurement points with different conditions in a FOV is not explained.

A charged particle beam device aiming at realization of setting appropriate energy filter conditions corresponding to respective regions even when plural regions with different emission conditions of secondary electrons are included in a FOV.

Solution to Problem

As one aspect for achieving the above object, a charged particle beam device having a detector for detecting charged particles obtained on the basis of scanning of a beam emitted from a charged particle source and an energy filter for energy-filtering the charged particles emitted from a sample is proposed, which calculates index values in a plurality of regions contained in a scanning region of the charged particle beam and calculates differences between the plurality of index values and reference index values set for each of the plural regions with respect to each of a plurality of energy filter conditions.

Advantageous Effects of Invention

According to the above structure, even when plural regions with different emission conditions of secondary electrons are contained in a FOV, it is possible to set appropriate energy filter conditions corresponding to respective regions.

BRIEF DESCRIPTION OF DRAWINGS

FIG. 1 is a flowchart showing steps of setting an energy filter.

FIG. 2 is a view showing an example of a GUI (Graphical User Interface) on which ROIs (Region Of Interest) where voltages of the energy filter are determined, determination indexes of filter voltages and a threshold are set.

FIG. 3 is a view showing a standard deviation distribution of an index with respect to energy filter voltages.

FIG. 4 is a view showing a brightness distribution of ROIs with respect to energy filter voltages.

FIG. 5 is a diagram showing an outline of a scanning electron microscope.

FIG. 6 is a view showing images and profile variation obtained when the energy filter is applied to a via/trench pattern.

FIG. 7 is a diagram showing an example of a semiconductor measurement system including a scanning electron microscope.

FIG. 8 is a graph indicating variation of length measurement values (CD result) with respect to variation of energy filter conditions.

DESCRIPTION OF EMBODIMENTS

A scanning electron microscope as a kind of charged particle beam devices is a device that generates an image of a sample or a waveform signal for measurement by detecting electrons emitted from the sample by irradiating the sample with an electron beam. There is a scanning electron microscope provided with an energy filter. The energy filter is configured by stacking, for example, three mesh electrodes, which restricts passing of electrons having energy lower than an applied voltage by applying a negative voltage to the central mesh electrode. For example, when −50V is applied to the central mesh electrode and an earth potential is applied to two mesh electrodes sandwiching the central mesh electrode, it is possible to restrict passing of electrons having energy lower than 50 eV and to allow electrons having high energy to selectively pass to be detected.

The above energy filter can perform desirable measurement and inspection by applying an appropriate voltage. For example, there is a case where a relation between the applied voltage of the energy filter and the brightness of an image is calculated to determine observation conditions. At this time, a filter voltage can be calculated by using contrast of the image as an evaluation reference, however, it is necessary to search and determine an energy filter voltage every time when optimum filter voltages are different in each visual field, which reduces throughput of inspection.

Also in the case where a condition in which the contrast is maximum is selected at each place, it may be difficult to compare dimensions between images as energy of detected electrons differs between images due to the difference of filter voltages. On the other hand, when a potential contrast image is acquired by prioritize throughput without changing the energy filter voltage, there is a possibility that difference in charging on the sample side leads to variation in length measurement values.

It is necessary to select filter conditions under the consideration of the above circumstances. In the present embodiment, a charged particle beam device capable of selecting filter conditions suitable for plural patterns included in a visual field will be explained.

In the embodiment explained below, for example, a charged particle beam device having an energy filter for energy-filtering charged particles emitted from a sample includes an arithmetic processor for setting filter conditions of the energy filter is proposed, in which the arithmetic processor sets filter conditions of the energy filter so that two or more index values (parameters) obtained based on irradiation of a charged particle beam with respect to a region containing two or more different patterns or ROIs will be predetermined conditions.

According to the embodiment explained below, throughput can be improved by performing observation in predetermined conditions while suppressing variation of potential contrast images among plural image.

In the embodiment explained below, explanation will be made mainly concerning a charged particle beam device capable of finding optimum conditions of the energy filter voltage corresponding to observation needs such as length measurement reproducibility which differ according to operators while securing visibility (contrast and so on) of a ROI (Region Of Interest) containing measurement points and so on when performing signal discrimination by the energy filter. Moreover, a charged particle beam device capable of providing a detected electron image in an arbitrary energy band based on information such as brightness and so on with respect to the energy filter voltage obtained in the process will be explained.

In the embodiment explained below, explanation will be made concerning, for example, a charged particle beam device including an objective lens that focuses a charged particle beam emitted from a charged particle beam source, a deflector that changes a scanning position of the charged particle beam, a controller that performs control of the scanning deflector, a sample stage for mounting a sample, an energy filter that discriminate charged particles emitted from the sample by energy of the charged particles and a detector that detects charged particles passing through the filter, in which the energy filter voltage is repeatedly changed at least in two or more places to acquire plural potential contrast images as an operation of setting conditions for setting observation conditions before regular observation, and the energy filter voltage can be selected from these images.

When the energy filter voltages and the potential contrast images are acquired in plural places, thereby acquiring potential contrast images while suppressing variation with respect to preferential indexes such as contrast and a length measurement value in measurement places.

FIG. 5 shows a schematic diagram of a scanning electron microscope as a kind of the charged particle beam device including an energy filter. An electron beam 502 generated in an electron gun 501 is converged by a condenser lens 503, and is lastly converged onto a sample 506 by an objective lens 505. The electron beam 502 is allowed to sweep (hereinafter also referred to as "scan") on an electron beam scanning region on the sample by the deflector 504. When primary electrons are allowed to scan two-dimensionally, the primary electrons scattered inside the sample by irradiation excite the sample, and second electrons 507 are emitted from the sample. The emitted second electrons 507 are discriminated by an energy filter 509 using energy of secondary electrons, then, the electrons are detected by a detector 508 and an electric signal is converted into an image, thereby performing observation/measurement of the sample. A SEM illustrated in FIG. 5 includes an image memory that stores detection signals with respect to respective pixels, and the detection signals are stored in the image memory.

In the case where the sample to be observed by the SEM is a dielectric substance, two-dimensional charging distribution is formed in a scanning region (FOV) during observation by the SEM. Electrons mainly detected by the SEM are secondary electrons having a large emission amount and low energy (up to several eV), therefore, the electrons are easily affected by slight charging formed on the surface. Accordingly, an image to be obtained varies according to what kind of charging distribution is formed at the time of irradiation in SEM observation of the sample to be charged.

In the case where a filter voltage easily affected by the sample charging is set at the time of energy discrimination, it has been found that large variation occurs in image quality such as contrast inversion. On the other hand, there is a case where observation of the ROI itself is difficult (an amount of second electrons which is desirable to observe is small) in normal detection of secondary electrons due to miniaturization and complication of structures in recent semiconductor devices. In response to this, a method of performing observation by high energy electrons such as back scattering electrons (BSE) is considered as one of solutions, however, the emission amount of the BSE is small with respect to secondary electrons. Accordingly, large current and high frame integration are necessary for improving image quality (S/N), and there is a problem of throughput reduction. As high energy electrons include electrons scattered in the sample, there is a case where minute difference of several nano-meters is not capable of being discriminated. Accordingly, it is desirable to perform observation by secondary electrons having a large signal amount with respect to the BSE both in throughput and in sensitivity for shape change, however, there is a case where a portion with a low brightness (dark) exists in a ROI and measurement or inspection is difficult in the above-described forefront devices.

The above phenomenon occurs due to relatively low brightness in the ROI as plural regions where a detection amount of secondary electrons is high and regions where the amount is low in the same visual field due to difference in materials or patterns (if the signal amount on the entire surface in the FOV is low, the problem can be solved by increasing irradiation current). Therefore, it is considered to be effective that the difference in the detection amount of secondary electrons between two regions is reduced by signal discrimination for increasing brightness of plural ROIs, however, potential contrast images are not stable according to observation location as the energy distribution of secondary electrons are affected by sample charging extremely easily, therefore, setting of the energy filter voltage was extremely difficult. Variation of images when the energy filter voltages are applied will be explained with reference to FIG. 6.

Here, an example in which detected electron images are obtained by simulation concerning a via/trench pattern in which vias exist in trenches and effects of the energy filters are evaluated is shown. Differences of charging are represented by using two kinds of models with different depths of vias. It is found that variations of profiles differ according to energy filter voltages though there is no difference in bottom depth between the images. In particular, when a filter voltage of 2V is applied, falling points in the bottom are largely deviated, which indicates that the length measurement value largely varies according to the filter voltage. Meanwhile, profiles in bottom portions almost overlap each other in 5V and 10V, and the difference in length measurement values is small. As described above, it is necessary to select the optimum energy filter voltage in measurement in potential contrast images.

As a solution for the above problems, a method of determining the energy filter voltage capable of suppressing variations of respective indexes such as contrast and the length measurement value on the basis of images in which the energy filter is changed with respect to plural patterns will be explained with reference to the drawings.

FIG. 1 shows a flowchart for setting energy filter conditions. First, movement to an observation location is accomplished, and SEM images including ROIs are acquired in at least two places or more. Though the minimum number of images is two, it is desirable to acquire images as many as possible because the more the number of images increases, the higher the determination accuracy of indexes increases. In this case, observation magnifications, observation angles (angles of FOVs with respect to observation patterns) and the numbers of frames are set to be equivalent. In this case, plural FOVs are set in, for example, regions containing patterns having the same material and structure in different positions on a sample.

In this case, data is acquired in positions where variation in length measurement values in secondary electron images acquired in a condition without the energy filter or variation in length measurement values in reflected electron images obtained when 50V of an energy filter voltage is applied with respect to a surface potential is equal to or less than a threshold. At this time, it is desirable to use reflected electron images when effects of charging (shading, deformation and so on) seem obvious in secondary electron images, or when signals in length measurement positions are hardly obtained.

The above is performed by discriminating a case where contrast varies due to the difference in charging at the time of applying the energy filter from a case where contrast varies due to dimensions themselves. Accordingly, places where dimensions are originally different are excluded from targets for setting energy filters, and the following processing is executed to only places dimensions of which are included within a fixed threshold.

Next, regions (ROIs) where length measurement (management) is performed in the FOV are designated with respect to the obtained SEM images. Here, as an index for optimization, one of an average signal amount (brightness) of the ROI, a contrast ratio with respect to a place separately designated, CNR (Contrast to Noise Ratio) with respect to a place separately designated and a length measurement value is designated on a GUI.

When the contrast ratio is designated, the ROI and a region where the contrast ratio is calculated are additionally designated. CNR indicates a size of contrast in the ROI with respect to noise, and a noise determination region is also designated in addition to the region where the contrast ratio is calculated. Moreover, a variation range (maximum/minimum) of the energy filter, changing steps, thresholds for determining obtained index values are also designated here (the details will be later described). In this process, reference data for evaluating later-described variation and so on is generated with respect to each ROI. In an arithmetic device included in a controller provided in the scanning electron microscope, index values are calculated in a unit of selected ROI and registered in a designated storage medium as reference data to be used for later-described calculation.

Next, SEM images are acquired while changing the energy filter voltage in designated visual field positions (which may be plural positions). Index values of the ROIs set in the previous stage are calculated with respect to respective energy filer voltages, and standard deviations of the index in respective filter voltages are calculated. Condition in which the obtained standard deviations are equal to or less than a threshold are selected as filter conditions. When plural filter voltages correspond, an operator can select the condition on the GUI while seeing respective filter images. It is also preferable that index value is changed (for example, from the contrast to the length measurement value) with respect to images which have been already acquired to evaluate results. Similarly, plural indexes can be combined in post processing. Observation is performed based on the obtained energy filter condition.

Next, designation of the ROI and so on will be explained. The ROI is achieved on an image previously acquired (or layout data). The ROI is set by designating an arbitrary two-dimensional region on an image. FIG. 2 is a view showing an example of a GUI screen for setting operation conditions of a SEM displayed on a later-described input device and so on. On the GUI screen illustrated in FIG. 2, a SEM operation condition setting unit 201, a brightness analysis setting unit 202, an image evaluation index setting unit 203 and an index threshold setting unit 204 are provided. In the SEM operation condition setting unit 201, coordinates of an observation point, a pattern kind, a variation width and variation steps of the energy filter voltage, the number of frames and a rotation angle can be set. In the brightness analysis setting unit, whether brightness change in a setting region with respect to the energy filter voltages is analyzed or not can be designated. Plural places can be selected as regions where brightness analysis is performed. Next, in the image evaluation index setting unit 203, evaluation indexes of images obtained with respect to respective energy filter voltages are set. As index values, contrast, average brightness, CNR and length measurement values can be selected. The determination reference of the index selected here is set by the index threshold setting unit 204. The reference is designated by an allowable rate [%] of variation in cases of contrast, average brightness and CNR, and is designated by a length [nm] in the case of the length measurement value. The designation of brightness analysis regions, contrast determination regions and so on are performed on the setting screen.

Next, display of results obtained after the energy filter voltage is changed and data is acquired will be explained with reference to FIG. 3. FIG. 3 is an example in which standard deviations of the contrast with respect to the energy filter voltages are displayed. The standard deviations of respective filter voltages are displayed with respect to a set threshold. When there are plural conditions to be candidates, the operator can select an arbitrary voltage. When each plotted point is double-clicked, an image group of the voltage is displayed and the condition can be selected while referring to images. Moreover, the index can be selected at the upper left of a window, and results of another index with respect to the acquired image group can be also displayed. It is also preferable that results are evaluated by combining plural indexes. In this case, thresholds of respective indexes have to be respectively designated. In the arithmetic device and so on included in the controller provided in the scanning electron microscope, a filter voltage in which the standard deviation among images is the smallest (variation of contrast is small in plural ROIs) is selected.

The display of results obtained when brightness analysis is designated will be explained with reference to FIG. 4. When brightness analysis is checked in the setting screen of FIG. 2, variation of brightness with respect to the energy filter voltages is analyzed. In this case, a case where three regions shown in FIG. 2 are set will be explained. In FIG. 4, variations (Δbrightness) of brightness (S-curves) in respective regions with respect to the energy filter voltages are shown. They indicate energy distributions of detected electrons, which are results reflecting charging distributions on the surface. When charging on the sample is not uniform, the energy distributions in respective regions are separated as shown in FIG. 4. The energy filter is normally a high-pass filter, however, band-pass filter images of energy can be obtained in this case by calculating images to which different energy filter voltages are applied. In the arithmetic device and the like included in the controller provided in the scanning electron microscope, at least two filter voltage conditions of at least (1) and (2) are selected and an operation program (recipe) for measurement is set.

In the above embodiment, first, an image (a first image) to be reference data is acquired, and index values (first index values) of set plural regions (a first ROI group) are calculated from the reference data imaged. Next, an image (a second image) in a region that is different from the region where the reference data image is acquired and that contains a pattern equivalent to a pattern contained in the reference data image, and index values (second index values) of plural regions (a second ROI group) contained in the image are calculated. The first ROI group and the second ROI group are set in the equivalent pattern with different visual fields. Such second index values are calculated for each of energy filter conditions. On that basis, variation of the second index values with respect to the first index values is calculated for each of the energy filter conditions as illustrated in FIG. 3.

For example, when there are three ROIs (ROI1, ROI2 and ROI3), differences between the first index values and the second index values are calculated with respect to respective ROIs, and an energy filter condition having the smallest statistic value in three differences of index values is selected. In a later-described arithmetic processor, the above calculation is executed based on operations by a recipe for allowing the scanning electron microscope to perform the above processing automatically.

According to the above processing, the energy filter condition suitable for any of plural ROIs contained in the FOV can be selected. It is desirable to select the energy filter condition in which variation is the smallest, however, it is also preferable to extract a condition by using "AND" with respect to other conditions. In this case, for example, two kinds of index values are calculated concerning the length measurement value and the contrast, and an energy filter condition in which standard deviation values of both index values are equal to or less than a predetermined value may be selected.

In FIG. 2, when the ROI is a region A, signals in A are far less than those of B and C, therefore, it is difficult to separate signals of only A by the energy filter (when signals of A is detected, signals of B is contained). In such case, an energy filter of two conditions (voltage (1) and voltage (2)) is set, and obtained images are calculated (subtraction) to thereby evaluate bandpass images of energy in a simple manner. At this time, the operator designates two kinds of filter voltages (minimum, maximum) on the graph of the brightness analysis result window shown in FIG. 4 by using a mouse and so on, thereby designating a bandpass condition. Moreover, bandpass images in the current result can be displayed by pressing a button of "Image Calculate" on an upper part of the window.

Next, a method of determining a filter voltage based on stability of index values will be explained. FIG. 8 is a graph indicating a relation between filter voltages and length measurement values of the regions A and B. The region A corresponds to a via contained in a trench, and diameters of the vias (length measurement values) in respective filter voltages are calculated by calculating peak-to-peak distances of brightness profiles. The region B corresponds to a trench, and dimensions (for example, widths) of the trench in respective filter voltages are calculated. In the example of FIG. 8, length measurement values are largely separated as original dimensions are different between the via and the trench.

For example, when a material on the outermost surface is a material which is easily charged, energy of electrons emitted from regions A and B varies according to charging states. For example, when the sample on the outermost surface is positively charged, electrons emitted from regions A and B are decelerated for the charging when emitted from the sample. Variation of energy of emitted electrons is equivalent to variation of the energy filter condition. It is desirable to set the filter voltage also in consideration of such condition, however, it may be difficult to grasp the charging state from the first stage.

Accordingly, a variation 801 of measurement values of the trench and a variation 802 of measurement values of the via obtained when the filter voltage is changed are acquired and a filter voltage 803 in which variation between the both becomes "zero" or equal to or less than a predetermined value is calculated in the present example. In this case, for example, the variations 801 and 802 are differentiated and a voltage in which a differential value is equal to or less than a predetermined value is determined. Furthermore, a filter voltage 806 obtained by adding a predetermined value 805 to the filter voltage 803 is calculated. The filter voltage 806 is a filter voltage in which any of measurement values of the via and the trench does not vary if the surface charging varies for an amount of the predetermined value 805 by way of example.

As described above, the index values are calculated in respective ROIs or respective measurement points, and the filter voltage is calculated based on evaluation of the index values, thereby calculating the filter voltage in which the index values hardly vary due to occurrence of charging and so on.

<Cooperation with Design Data>

A controller of the scanning electron microscope has a function of controlling respective components of the scanning electron microscope and forming an image based on detected electrons and a function of deriving an average signal amount and a contrast ratio of the predetermined ROI based on an intensity distribution of the detected electrons. FIG. 7 shows an example of a pattern measurement system including an arithmetic processor 603.

The system includes a scanning electron microscope system formed by a SEM body 601, a controller 602 of the SEM body and the arithmetic processor 603. The arithmetic processor 603 incorporates an arithmetic processing unit 604 supplying a given control signal to the controller 602 and executing signal processing of a signal obtained in the SEM body 601 and a memory 605 storing obtained image information and recipe information. Though the controller 602 and the arithmetic processor 603 are explained as separate units in the embodiment, they can be formed as an integral controller.

After electrons emitted from the sample by beam scanning by a deflector 606 or electrons generated by a conversion electrode pass through an energy filter 607, the electrons are trapped by a detector 608 and converted into a digital signal by an A/D converter incorporated in the controller 602. Image processing corresponding to objects is performed by image processing hardware such as CPU, ASIC and FPGA incorporated in the arithmetic processor 602.

The arithmetic processing unit 604 incorporates a measurement condition setting unit 609 setting measurement conditions such as scanning conditions of the deflector 606 and an image feature amount arithmetic unit 610 calculating brightness and contrast in the ROI inputted by an input device 614 from obtained image data. The arithmetic processing unit 604 also incorporates a design data extraction unit 611 reading design data out from a design data storage medium 613 in accordance with a condition inputted by the input device 614 and converting vector data into layout data according to need. A pattern measurement unit 612 measuring pattern dimensions based on an acquired signal waveform is also incorporated. In the pattern measurement unit 612, a line profile is formed based on, for example, a detection signal and dimension measurement between peaks of the profile is executed.

Moreover, a GUI for displaying images, inspection results and so on for the operator is displayed on a display device provided in the input device 614 connected to the arithmetic processor 603 through a network.

Part or all of control and processing in the arithmetic processor 603 can be processed/controlled by being allocated to an electronic computer in which CPU and a memory capable of storing images are mounted. Moreover, the controller 602 and the arithmetic processor 603 may be formed as one arithmetic device. The input device 614 also functions as an imaging recipe creating device that sets measurement conditions including coordinates of electron devices necessary for inspection and so on, kinds of patterns, imaging conditions (optical conditions and moving conditions of the stage) as an imaging recipe. The input device 614 also has a function of collating inputted coordinate information and information concerning kinds of patterns with layer information of design data and identification information of patterns and reading necessary information out from the design data storage medium 613.

The design data stored in the design data storage medium 613 is expressed as a GDS format or an OASIS format, and stored as a predetermined format. The type of design data does not matter as long as software displaying design data can display the format type and data can be dealt with as graphic data. The graphic data may be line segment image information to which deformation processing that brings a pattern close to an actual pattern by performing exposure simulation is performed instead of line segment image information indicating an ideal shape of a pattern formed based on design data.

In the measurement condition setting unit 609, suitable scanning conditions are set by steps illustrated in FIG. 2. For example, operation conditions of the device is automatically set by setting a size of a FOV, a position (coordinates) of the FOV, a size of a ROI and a position of the ROI to layout data in the vicinity of a measurement target pattern extracted by the design data extraction unit 611 by using the input device 614. More specifically, a FOV position for each of combinations of plural scanning speed conditions and plural conditions of intervals between irradiation points is determined. At this time, plural regions having the same pattern structure in the FOV as well as positioned at other places are selected and registered as FOVs.

The design data extraction unit 611 reads design data out from the design data storage medium 613 in accordance with conditions inputted by the input device 614 and converts vector data into layout data according to need, thereby setting FOVs and ROIs on the layout data.

The measurement condition setting unit 609 changes the above-described energy filter voltage. The image feature amount arithmetic unit 610 extracts signal information of ROIs from acquired images and generates display signals for the input device 613. The image feature amount arithmetic unit 610 derives index values (a contrast ratio with respect to a designated portion and so on) in the ROIs which have been previously set for each energy filter voltage based on the detection signal, and displaying the graph indicating the energy filter voltages and standard deviations of index values and the graph of brightness as illustrated in FIG. 3 and FIG. 4 on the display screen or the like of the input device 614.

REFERENCE SIGNS LIST

201 SEM operation condition setting unit
202 brightness analysis setting unit
203 image evaluation index setting unit
204 index threshold setting unit
205 ROI setting screen
501 electron source
502 electron beam
503 condenser lens
504 deflector
505 objective lens
506 sample
507 secondary electrons
508 detector
509 energy filter
601 SEM body
602 controller
603 arithmetic processor
604 arithmetic processing unit
605 memory
606 deflector
607 energy filter
608 detector
609 measurement condition setting unit
610 image feature amount arithmetic unit
611 design data extraction unit
612 pattern measurement unit
613 design data
614 input device

The invention claimed is:

1. A charged particle beam device including a detector for detecting charged particles obtained on the basis of scanning of a charged particle beam emitted from a charged particle source and an energy filter for energy-filtering the charged particles emitted from a sample, the device comprising:
a deflector for scanning the charged particle beam on a scanning region or a plurality of scanning regions on the sample; and
one or more computer systems for controlling the deflector and the energy filter, and processing data received from the detector,
wherein the one or more computer systems are configured to:
control the energy filter such that filtering conditions of the energy filter are in a plurality of states,
form one or more images of the scanning region or the plurality of scanning regions for different filtering conditions based on an output of the detector,
calculate a plurality of index values of a plurality of regions of interest included in the one or more images,
calculate variation of the plurality of index values of the plurality of regions of interest for each of the different filtering condition based on the calculated index values, and
output a filtering condition in which the calculated variation is a minimum or a filtering condition in which the calculated variation is less that a predetermined value.

2. The charged particle beam device according to claim 1, wherein the one or more computer systems calculate standard deviations of the index values for each respective portion.

3. The charged particle beam device according to claim 2, wherein the one or more computer systems select the energy filter voltages in which the variation is the minimum or which satisfy given conditions.

4. The charged particle beam device according to claim 1, wherein the index values are at least one of contrast information for each respective portion, a pattern length measurement value and a contrast noise ratio concerning the regions.

5. The charged particle beam device according to claim 4, further comprising:
an input device for setting at least one of the contrast information, the length measurement value and the contrast noise ratio concerning the regions, and regions in which at least one index value is evaluated.

6. The charged particle beam device according to claim 1, wherein the one or more computer systems display standard deviations of index values of each of energy filter conditions and brightness values of respective regions on a GUI by graphs, and sets observation conditions or image calculation conditions on the GUI based on these graphs.

7. The charged particle beam device according to claim 1, wherein the one or more computer systems select regions from design data based on a predetermined shape and searches energy filter voltages in which the index values are equal to or less than a threshold.

8. The charged particle beam device according to claim 1, wherein the index values are length measurement values of a pattern, and
dimensions of the pattern to be reference index values and dimensions of the pattern contained in regions within the scanning region of the charged particle beam fall within a given threshold.

9. A method for determining a filtering condition for a charged particle beam device including a detector for detecting charged particles obtained based on scanning of a charged particle beam emitted from a charged particle source and an energy filter for energy-filtering the charged particles emitted from a sample, the method comprising:
scanning the charged particle beam on a scanning region or a plurality of scanning regions on the sample;
controlling the deflector and the energy filter, and processing data received from the detector;
controlling the energy filter such that filtering conditions of the energy filter are in a plurality of states;
forming one or more images of the scanning region or the plurality of scanning regions for different filtering conditions based on an output of the detector;
calculating a plurality of index values of a plurality of regions of interest included in the one or more images;
calculating variation of the plurality of index values of the plurality of regions of interest for each of the different filtering condition based on the calculated index values; and
outputting a filtering condition in which the calculated variation is a minimum or a filtering condition in which the calculated variation is less that a predetermined value.

* * * * *